(12) United States Patent
Punzo et al.

(10) Patent No.: US 7,492,158 B2
(45) Date of Patent: Feb. 17, 2009

(54) METHOD FOR DETERMINING CONSTRUCTION PARAMETERS OF MAGNET STRUCTURES DESIGNED TO GENERATE MAGNETIC FIELDS IN PREDETERMINED VOLUMES OF SPACE AND METHOD FOR CORRECTING MAGNETIC FIELDS IN PREDETERMINED VOLUMES OF SPACE, PARTICULARLY IN MRI APPARATUS

(75) Inventors: Vincenzo Punzo, San Giorgio a Cremano (IT); Stefano Pittaluga, Genoa (IT); Stefano Besio, Genoa (IT); Alessandro Trequattrini, Genoa (IT)

(73) Assignee: Esaote S.p.A., Milan (IT)

( * ) Notice: Subject to any disclaimer, the term of this patent is extended or adjusted under 35 U.S.C. 154(b) by 102 days.

(21) Appl. No.: 11/515,760

(22) Filed: Sep. 6, 2006

(65) Prior Publication Data
US 2007/0229077 A1 Oct. 4, 2007

Related U.S. Application Data

(60) Provisional application No. 60/788,703, filed on Apr. 4, 2006.

(51) Int. Cl.
*G01V 3/00* (2006.01)
(52) U.S. Cl. ...................................... 324/320; 324/319
(58) Field of Classification Search ................ 324/320, 324/319
See application file for complete search history.

(56) References Cited

U.S. PATENT DOCUMENTS 5,313,164 A * 5/1994 Starewicz et al. ........... 324/318

(Continued)

FOREIGN PATENT DOCUMENTS

EP 0 940 686 A 9/1999

OTHER PUBLICATIONS

S. Crozier et al.: "Ellipsoidal harmonic MRI shims", IEEE Transactions on Applied Superconductivity, vol. 12, No. 4, 2002, pp. 1880-1885.

(Continued)

*Primary Examiner*—Louis M Arana
(74) *Attorney, Agent, or Firm*—Buchanan Ingersoll & Rooney PC (57) ABSTRACT

A method for determining construction parameters of magnet structures designed to generate magnetic fields in predetermined volumes of space, comprising the steps of: a) defining a predetermined volume of space in which a static magnetic field is to be generated; b) defining the nominal strength and profile of the magnetic field in said predetermined volume of space; c) mathematically describing the nominal magnetic field on the surface of and/or in said predetermined volume of space by using a polynomial expansion of the magnetic field-describing function, which provides a series of coefficients; d) determining the size, geometry and relative position in space of the means for generating said nominal magnetic field, with respect to the volume of space in and on which the desired, i.e. nominal magnetic field, is defined. According to the invention, the predetermined volume of space is delimited by an ideal ellipsoidal closed surface and the magnetic field is expressed by coefficients of a polynomial ellipsoidal harmonic expansion. The method may be also used as a shimming method in volumes of space ideally delimited by ellipsoidal closed surfaces, to be implemented whether or not the predetermined volume of space defined by the magnet structure is also delimited by an ideal closed surface, with an ellipsoidal or other shape.

14 Claims, 3 Drawing Sheets

Projection of the 3D Gaussian grid in the *xy* plane

U.S. PATENT DOCUMENTS 7,218,114 B2 * 5/2007 Ni et al. ...................... 324/321

OTHER PUBLICATIONS

Lui Q et al.: "General expressions for the magnetic field and stored energy of the elliptic cylinder coils", Journal of Magnetic Resonance, Series B, vol. 113, Dec. 1996, pp. 222-227.

F. Roméo, D.I. Hoult: "Magnetic Field Profiling: Analysis and Correcting Coil Design" Magnetic Resonance in Medicine, vol. 1, 1984, pp. 44-65.

D.I. Hoult, R. Deslauriers: "Accurate shim-coil design and magnet-field profiling by a power-minimization-matrix method", Journal of Magnetic Resonance, Series A, vol. 108, May 1994, pp. 9-20.

European Search report dated Apr. 18, 2007.

* cited by examiner

Figure 1: Two-dimensional grid of Gaussian abscissas

Figure 2: Three-dimensional grid (continuous line) of Gaussian abscissas in cartesian coordinates and reference ellipsoid (a=90, b=80, c=70).

Figure 3: Projection of the 3D Gaussian grid in the *xy* plane

Figure 4: Reference ellipsoid and Brillouin sphere

Figure 5 : profile of ellipsoidal cosine coefficients for 'even–even' symmetry

Figure 6 : profile of ellipsoidal sine coefficients for 'even-even' symmetry

METHOD FOR DETERMINING CONSTRUCTION PARAMETERS OF MAGNET STRUCTURES DESIGNED TO GENERATE MAGNETIC FIELDS IN PREDETERMINED VOLUMES OF SPACE AND METHOD FOR CORRECTING MAGNETIC FIELDS IN PREDETERMINED VOLUMES OF SPACE, PARTICULARLY IN MRI APPARATUS

This application claims priority under 35 U.S.C. § 119(e) to U.S. Provisional Application Ser. No. 60/788,703, filed Apr. 4, 2006.

A method for determining construction parameters of magnet structures designed to generate magnetic fields in predetermined volumes of space, comprising the steps of:

a) defining a predetermined volume of space in which a static magnetic field is to be generated;

b) defining the nominal strength and profile of the magnetic field in said predetermined volume of space;

c) mathematically describing the nominal magnetic field on the surface of and/or in said predetermined volume of space by using a polynomial expansion of the magnetic field-describing function, which provides a series of coefficients;

d) determining the size, geometry and relative position in space of the means for generating said nominal magnetic field, with respect to the volume of space in and on which the desired, i.e. nominal magnetic field, is defined.

The mathematical means that are currently used to carry out these steps consist of a polynomial expansion of the magnetic field describing function, which is based on volumes of space defined by spherical surfaces.

Here, the polynomial expansion provides a series of coefficients to uniquely describe the magnetic field features, which coefficients are spherical harmonics (see for instance SV98A00015).

Currently available mathematical instruments allow to define magnet structures in relation to static magnetic fields with a predetermined homogeneity, which are distributed in volumes of space delimited by ideal spheres.

Particularly referring to a MRI apparatus, its magnet structure delimits a cavity for receiving a body or a part of a body, which cavity has one, two, three or more open sides. The magnet structure is designed to generate a static magnetic field to permeate the cavity space. Due to magnetic field perturbations caused by such opened sides, the static magnetic field only has the homogeneity required to ensure a sufficient image quality for diagnostic imaging in a partial volume of the overall cavity volume. This partial volume which is defined, as previously mentioned, by an ideal sphere, must have a sufficient size to receive the part of the body under examination. Furthermore, this partial volume of space, also known as Field of View, must not intersect or be tangent to the magnet structure, and must not extend outside it.

Since the morphology of the organs or anatomic regions that are typically examined by MRI is far from being spherical, then wide portions of space within the ideal sphere extend beyond the volume actually occupied by the limb or anatomic region to be examined.

As a result, the magnet structure must be sufficiently large to define and delimit a cavity having at least a sufficient size to contain the partial volume of space or field of view delimited by the ideal sphere, with the sphere never coming in contact with the magnet structure. Therefore, the size and weight of the magnet structure, which are often considerable per se, are greater than is currently required to contain the limb, body part or anatomic region to be examined, also due to a redundant or unnecessary portion of the partial volume within which the magnetic field generated thereby must have sufficient characteristics to allow useful diagnostic imaging.

Also, during the design and construction of the magnet structure, a relatively high inhomogeneity tolerance threshold is set for the magnetic field in said partial volume, which is generally of the order of about one thousand of parts per million and in a subsequent step, known as shimming, this threshold is dramatically decreased to values of a few parts per million, however such shimming step must occur over the whole partial volume delimited by the ideal sphere, even on useless portions thereof, which are not occupied by the limb, the organ, body part or anatomic region under examination.

Inhomogeneity tolerance shall be intended herein as magnetic field tolerance within the predetermined volume of space, i.e. a volume in which the anatomic region to be examined is placed, such tolerance being typically of the order of a few units or tens of ppm (parts per million) peak to peak.

Therefore, the invention is based on the problem of providing a method as described hereinbefore, which allows to determine the suitable magnet structure to generate a homogeneous static magnetic field in a volume of space defined by a surface whose shape is more similar to that of a limb, an organ, a body part or an anatomic region under examination, without involving excessive time, cost and material requirements.

The invention achieves the above purposes by providing a method as described above, in which:

the predetermined volume of space is delimited by an ideal closed surface having an ellipsoidal shape;

the magnetic field is expressed by the coefficients of a polynomial expansion, which coefficients are ellipsoidal harmonics.

Thanks to the above, the volume of space in which the homogeneous magnetic field is generated may be better adapted to the shape of the limb, organ, body part or anatomic region under examination. This also allows to reduce the size of the cavity containing said volume of space, which constitutes a partial volume of said cavity, thence the size of the magnet structure.

In fact, a larger portion of the predetermined volume of space, in which the magnetic field has the required homogeneity, is filled by the limb, organ, body part or anatomic region under examination.

Particularly dedicated MRI apparatus, whose use is restricted to the examination of specific limbs or body parts or anatomic regions, such as a hand or a foot, or the lower or upper limbs, may have a smaller size than current apparatus, with equally sized fields of view, thanks to the increase of the filling ratio due to an improved adaptation of the partial volume of space in which the magnetic field has the required characteristics for imaging, to the morphology of the limb, body part or anatomic region under examination.

Once again in this invention, an inhomogeneity tolerance threshold of one to a few thousands of ppm is set in the design of the magnet structure and after construction, the magnet structure is subjected to a correction process, known as shimming, in which the inhomogeneity of the magnetic field within the predetermined volume of space is reduced below a tolerance threshold of the order of a few units to a few tens of ppm (parts per million) peak to peak, by measuring the magnetic field that was actually generated in said predetermined volume of space at several predetermined points in a grid of predetermined measuring points arranged in said predetermined volume of space delimited by the ideal closed surface, which ideally delimits said volume of space and/or along said ideal closed surface, comparing the actual measured magnetic field with the nominal desired field within said predetermined volume of space, determining the value of the magnetic moment of magnetic shims and the position thereof over one or more positioning grids, which positioning grids have a predetermined position and orientation relative to said predetermined volume of space.

These steps may be possibly sequentially repeated several times.

In this invention, the steps of correcting or shimming the static magnetic field in the predetermined volume of space also require the magnetic field in the predetermined volume of space and the magnetic field generated by the effects of magnetic shims to be described by ellipsoidal harmonics.

The use of this invention may be also limited to the correction or shimming step, e.g. combined with an existing magnet structure, in which the volume of space with the magnetic field having the required homogeneity for imaging, was designed with an ideal spherical shape. In this case, the correction or shimming step may be carried out by defining a second volume of space having an ellipsoidal shape, which is wholly inscribed or contained in the first spherical volume of space and by only performing correction and shimming in the second volume of space delimited by the ellipsoidal surface.

In both cases of use of this invention for correcting or shimming the magnetic field, the shim positioning grid may be of any type, i.e. a Cartesian grid, an annular grid, formed by the intersection of concentric circles and radiuses or an ellipsoidal grid, formed by a number of ellipses, one inside the other, intersecting with radiuses or adjacent parallel lines.

The latter arrangement provides the advantage of limiting the correction effort to a smaller volume, which is smaller than the volume defined by the ideal spherical delimiting surface. This facilitates or improves the shimming process.

The theory and implementations at the basis of the above methods of this invention will be now described in further detail, with reference to the accompanying drawings, in which.

BRIEF DESCRIPTION OF THE ELLIPSOIDAL INTEGRAL

Considering the non-one-to-one transformation of coordinates $$x^2 = \frac{\lambda_1^2 \lambda_2^2 \lambda_3^2}{h^2 k^2}$$

$$y^2 = \frac{(\lambda_1^2 - h^2)(\lambda_2^2 - h^2)(h^2 - \lambda_3^2)}{h^2(k^2 - h^2)}$$

$$z^2 = \frac{(\lambda_1^2 - k^2)(k^2 - \lambda_2^2)(k^2 - \lambda_3^2)}{k^2(k^2 - h^2)}$$

-continued where:

$$h^2 = a^2 - b^2$$

$$k^2 = a^2 - c^2$$

are the confocal distances of the reference ellipsoid:

$$\left(\frac{x}{a}\right)^2 + \left(\frac{y}{b}\right)^2 + \left(\frac{z}{c}\right)^2 = 1 \qquad (2)$$

Laplace's equation $$\nabla^2 B = 0 \qquad (3)$$

rewritten in these new coordinates (so-called ellipsoidal coordinates) provides a solution obtained by separation of variables, of the following type:

$$B(\lambda_1, \lambda_2, \lambda_3) = \sum_{n=0}^{\infty} \sum_{p=1}^{2n+1} \alpha_{np} \frac{E_n^p(\lambda_1)}{E_n^p(\lambda_1^{ref})} \cdot E_n^p(\lambda_2) E_n^p(\lambda_3) \qquad (4)$$

with $E_n^p(\lambda_1) E_n^p(\lambda_2) E_n^p(\lambda_3)$ being known as Lamé functions of order n and degree p (the quantity $E_n^p(\lambda_2) E_n^p(\lambda_3)$ being usually called ellipsoidal harmonic) and $$\alpha_{np} = \frac{1}{\gamma_n^p} \frac{E_n^p(\lambda_1^{ref})}{E_n^p(\lambda_1)} \int_E \int_{\lambda_1} \frac{B(\lambda_1, \lambda_2, \lambda_3)}{\sqrt{(\lambda_1^2 - \lambda_2^2)(\lambda_1^2 - \lambda_3^2)}} \cdot E_n^p(\lambda_2) E_n^p(\lambda_3) dS \qquad (5)$$

The quantities $\gamma_n^p$, in (5), are ellipsoidal harmonic normalization coefficients (so that the integral over the ellipsoid of each ellipsoidal harmonic is one), $$\gamma_n^p = \int_E \int_{\lambda_1} \frac{(E_n^p(\lambda_2) E_n^p(\lambda_3))^2}{\sqrt{(\lambda_1^2 - \lambda_3^2)(\lambda_1^2 - \lambda_2^2)}} dS \qquad (6)$$

The integrals in relations (5) and (6) are surface integrals extended over the surface defined by the relation $\lambda_1$=cost., which corresponds to the reference ellipsoid (2).

The surface element dS of the ellipsoid in the ellipsoidal coordinates is given by the quantity:

$$dS = \frac{(\lambda_2^2 - \lambda_3^2)\sqrt{(\lambda_1^2 - \lambda_2^2)(\lambda_1^2 - \lambda_3^2)}}{\sqrt{(\lambda_2^2 - h^2)(k^2 - \lambda_2^2)}\sqrt{(h^2 - \lambda_3^2)(k^2 - \lambda_3^2)}} \qquad (7)$$

whereby the relation (6) may be rewritten, after introducing the integration limits, as follows:

$$\gamma_n^p = 8 \int_0^h d\lambda_3 \int_h^k d\lambda_2 \frac{(\lambda_2^2 - \lambda_3^2)(E_n^p(\lambda_2) E_n^p(\lambda_3))^2}{\sqrt{(\lambda_2^2 - h^2)(k^2 - \lambda_2^2)}\sqrt{(h^2 - \lambda_3^2)(k^2 - \lambda_3^2)}} \qquad (8)$$

Similarly, the relation (5) becomes:

$$\alpha_{np} = \frac{8}{\gamma_n^p} \int_0^h d\lambda_3 \int_h^k d\lambda_2 \frac{(\lambda_2^2 - \lambda_3^2) B(\lambda_1, \lambda_2, \lambda_3) E_n^p(\lambda_2) E_n^p(\lambda_3)}{\sqrt{(\lambda_2^2 - h^2)(k^2 - \lambda_2^2)} \sqrt{(h^2 - \lambda_3^2)(k^2 - \lambda_3^2)}} \quad (9)$$

Ellipsoidal Integral and Gauss Method

As mentioned above, the ellipsoidal coefficients may be obtained by quantifying the integrals:

$$\gamma_n^p = \quad (0.1)$$

$$8 \int_0^h d\lambda_3 \int_h^k d\lambda_2 \frac{(\lambda_2^2 - \lambda_3^2)(E_n^p(\lambda_2) E_n^p(\lambda_3))^2}{\sqrt{(\lambda_2^2 - h^2)(k^2 - \lambda_2^2)} \sqrt{(h^2 - \lambda_3^2)(k^2 - \lambda_3^2)}}$$

and $$\alpha_{np} = \quad (0.2)$$

$$\frac{8}{\gamma_n^p} \int_0^h d\lambda_3 \int_h^k d\lambda_2 \frac{(\lambda_2^2 - \lambda_3^2) B(\lambda_1, \lambda_2, \lambda_3) E_n^p(\lambda_2) E_n^p(\lambda_3)}{\sqrt{(\lambda_2^2 - h^2)(k^2 - \lambda_2^2)} \sqrt{(h^2 - \lambda_3^2)(k^2 - \lambda_3^2)}}$$

where (0.1) are the ellipsoidal harmonic normalization coefficients and (0.2) are the coefficients of expansion of the field B to Lamé functions in ellipsoidal coordinates:

$$B(\lambda_1, \lambda_2, \lambda_3) = \sum_{n=0}^{\infty} \sum_{p=1}^{2n+1} \alpha_{np} \frac{E_n^p(\lambda_1)}{E_n^p(\lambda_1^{ref})} \cdot E_n^p(\lambda_2) E_n^p(\lambda_3) \quad (0.3)$$

The integral (0.3) may be rewritten as follows, after application of a mixed Gauss-Legendre and Gauss-Chebyshev method:

$$\gamma_n^p = 8 \sum_{i=1}^{N} \omega_i^C \omega_i^L (F_n^p(x_i^L) G_n^p(x_i^C) - G_n^p(x_i^L) F_n^p(x_i^C)) \quad (0.4)$$

where the quantities $F_n^p(x_i^L)$ and $G_n^p(x_i^C)$ are related to the ellipsoidal harmonics of degree n and order p, as determined in Gauss-Chebychev abscissas $x_i^C$ and Gauss-Legendre abscissas $x_i^L$, whereas the quantities $\omega_i^C$ and $\omega_i^L$ represent the respective weights. Similarly, the integral (0.2) is evaluated according to the following relation:

$$\alpha_n^p = \frac{2}{\gamma_n^p} \sum_{i=1}^{N/2} \sum_{j=1}^{N} \omega_i^C \omega_i^L B(x_i^C, x_i^L)(F_n^p(x_i^L) G_n^p(x_i^C) - G_n^p(x_i^L) F_n^p(x_i^C)) \quad (0.5)$$

where N represents the order of approximation that is used in the calculation. The field B in (0.5) is expressed in ppm and is normalized with respect to the value assumed at the center of the ellipsoid. The next paragraph will describe the complete algorithm to determine the quantities (0.4) and (0.5), involving, as a first step, the construction of ellipsoidal harmonics to the order n=N–1 and degree, which are not tabled functions (unlike spherical harmonics) but are constructed on the basis of the actual dimensions of the ellipsoid (i.e. on the values of the three semiaxes).

Algorithm for Determining Ellipsoidal Coefficients

The algorithm to calculate the ellipsoidal coefficients may be summarized in the following basic macrosteps:
 a. Construction of Lamé functions from the dimensions of semiaxes up to the order N−1.
 b. Calculation of normalization coefficients $\gamma_n^P$ according to (0.4).
 c. Calculation of expansion coefficients $\alpha_n^P$ by using (0.5).

As inputs, the algorithm receives the three semiaxes, the order of approximation N and the experimental measurement file, which makes it a general algorithm, adapted to be used for any ellipsoid.

The construction of ellipsoidal harmonics follows the matrix algorithm described in "Ellipsoidal harmonic expansions of the gravitational potential: theory and application", Garmier R., Barriot J. P., Celestial Mechanics and Dynamical Astronomy 79, pp. 235-275 (2001)

that will be summarized hereafter. A Lamé function $E_n^P(\lambda_i)$ of order n and degree p may be rewritten as a product of a function $\psi_n^P(\lambda_i)$, which is characteristic of the class of the above function (K, L, M, N) with a normalized polynomial $P_n^P(\lambda_i^2)$.

$$P_n^p(\lambda_i^2) = \sum_{j=0}^{m} b_j \left(1 - \frac{\lambda_i^2}{h^2}\right)^j \quad (0.6)$$

if i=3 and k instead of h if i=2. The quantities $b_j$ are the polynomial coefficients to be calculated and are a function of the semiaxes a, b, c of the characteristic ellipsoid:

$$b_j = b_j(a, b, c)$$

By replacing the equation (0.6) in Laplace equation in ellipsoidal coordinates (known as Lamé equation), the coefficients $b_j$ appear to be the components of the eigenvectors of an eigenvalue problem of the following type:

$$\mathbb{M}\vec{p} = p\vec{p} \quad (0.7)$$

where $\vec{p}$ is an eigenvector having components $(b_0, b_1, \ldots, b_r)^T$ and $\mathbb{M}$ is a tridiagonal matrix characteristic of the Lamé function class. For class K, such matrix will be as follows:

$$\mathbb{M}_K = \begin{pmatrix} \vec{d}_0 & \vec{g}_0 & 0 & 0 & 0 \\ \vec{f}_1 & \vec{d}_1 & \vec{g}_1 & \cdots & 0 \\ 0 & \vec{f}_2 & \vdots & \cdots & \vdots \\ \vdots & \vdots & \vdots & \cdots & \vdots \\ 0 & 0 & \vdots & \vec{f}_r & \vec{d}_r \end{pmatrix} \quad (0.8)$$

where the quantities $\vec{d}_i$, $\vec{g}_i$, $\vec{f}_i$ and are constructed from the semiaxes a, b, c (see "Ellipsoidal harmonic expansions of the gravitational potential: theory and application", Garmier R., Barriot J. P., Celestial Mechanics and Dynamical Astronomy 79, pp. 235-275 (2001) Annex 3). The Lamé harmonics for the other classes may be constructed in a similar manner.

Once the quantities $b_j^{n,p}$ have been determined, (0.4) may be applied to the points of the grid of plane $(\lambda_2, \lambda_3)$. Gauss-Legendre and Gauss-Chebyshev abscissas, as determined in the previous step, naturally define a two-dimensional grid $(\lambda_2, \lambda_3)$ in space, as shown in FIG. 1.

Figure 1:
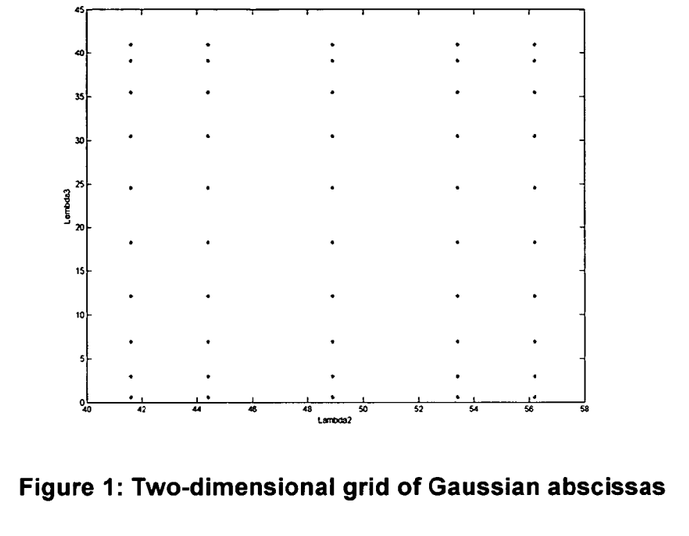
FIG. 1 shows a two-dimensional grid of Gaussian abscissas.

The grid of FIG. 1 is composed of N*N points in overlapping pairs, thence N*N/2 individual points, such overlapping structure being essentially the result of the initial construction of fixed-N Chebyshev abscissas. Since the coordinate transformation defined by equations (1) is not one-to-one, but one-to-eight, the grid of Gaussian abscissas only maps an octant (particularly the positive octant with x>0,y>0,z>0) of the Cartesian space (x,y,z), with $\lambda_1$=cost.=a (i.e. the reference ellipsoid belonging to the family of confocal ellipsoids) being previously set. From this octant, the whole three-dimensional Cartesian space may be reconstructed, by making use of symmetry properties, which allow to generate a 3D grid of Gaussian abscissas, transformed from ellipsoidal coordinates (where they were defined) to Cartesian coordinates, as shown in FIG. 2.

Figure 2:
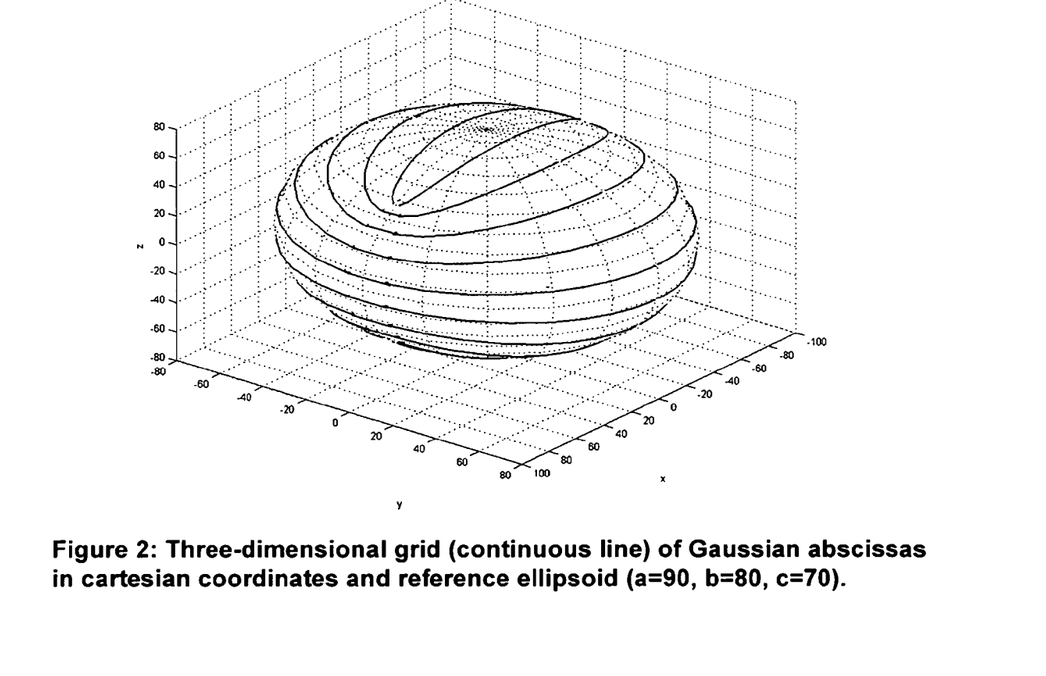
FIG. 2 shows the three-dimensional grid (continuous line) of Gaussian abscissas in Cartesian coordinates and reference ellipsoid (a=90, b=80, c=70).
Figure 3:
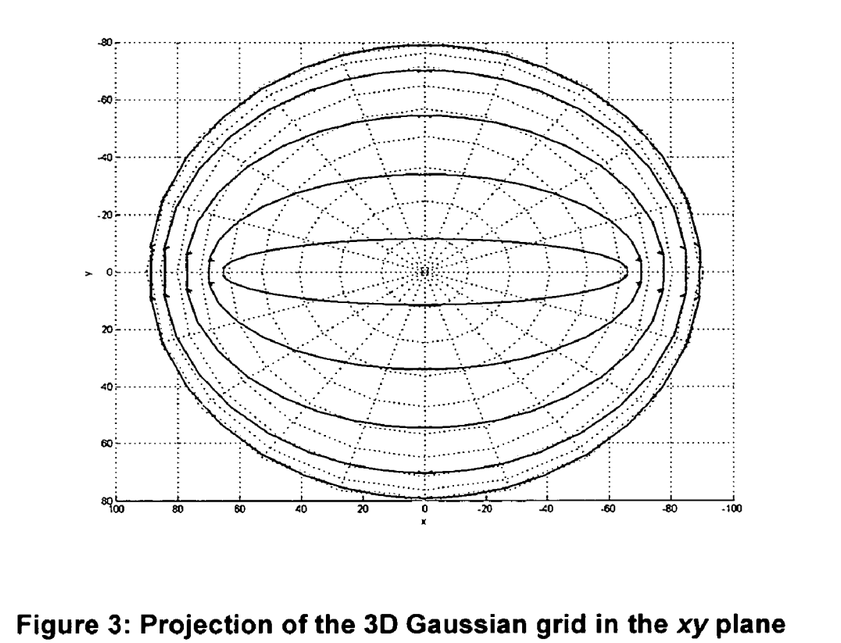
FIG. 3 shows the projection of the 3D Gaussian grid in the xy plane.

As shown in FIGS. 2 and 3, the Gaussian abscissas define a number N of ellipses over the surface of the ellipsoid, each formed by 4*N points. The following table indicates the number of points of the 3D grid, as N changes.

| Order | Number of ellipses | Number of points per ellipse | Total points |
|---|---|---|---|
| N = 8 | 8 | 32 | 256 |
| N = 10 | 10 | 40 | 400 |
| N = 12 | 12 | 48 | 576 |
| N = 20 | 20 | 80 | 1600 |

On such integral paths, (8) may be rewritten as follows:

$$\alpha_n^p = \frac{2}{\gamma_n^p} \sum_{i=1}^{N/2} \sum_{j=1}^{N} \omega_i^C \omega_i^L B(x_i^C, x_i^L)(F_n^p(x_i^L) G_n^p(x_i^C) - G_n^p(x_i^L) F_n^p(x_i^C)) \quad (14)$$

where a field B appears in the summation, which is sampled at points that correspond, as mentioned above, to the "mixed" Gaussian abscissas transformed into Cartesian coordinates. The following paragraph will describe a test on equation (14), with n=0 and p=1 (i.e. $\alpha_0^1$), and with a measurement of the field B over the ellipsoid being simulated.

Back to the algorithm, once the quantities $\gamma_n^p$ have been determined up to the order N−1, the algorithm computes the coefficient $\alpha_n^p$ by applying the equation (0.5) with the values of the sampled field to the 3D Cartesian grid obtained from the ellipsoidal coordinate grid.

Algorithm Testing and Validation

This paragraph proposes a number of tests and considerations on the above algorithm, through which the results may be checked for correctness, for a full validation of the algorithm as from the construction of ellipsoidal harmonics.

Test on Matrix Construction of Ellipsoidal Harmonics

Lamé functions up to the order n=3 inclusive, may be analytically computed in a relatively simple manner, as a function of the semiaxes a, b, c or more specifically as a function of the confocal distances h and k (see Annex 1). The analytical expression of such functions is as follows:

$K_0^1 = 1$ $n = 0$ $K_1^1(x) = x$ $L_1^2(x) = \sqrt{|x^2 - k^2|}$ $M_1^3(x) = \sqrt{|h^2 - x^2|}$ $n = 1$ $K_2^1(x) = x^2 - \frac{1}{3}\left[b^2 + c^2 - \sqrt{(b^2 + c^2)^2 - 3b^2 c^2}\right]$ $K_2^2(x) = x^2 - \frac{1}{3}\left[b^2 + c^2 + \sqrt{(b^2 + c^2)^2 - 3b^2 c^2}\right]$ $L_2^3(x) = x\sqrt{|x^2 - k^2|}$ $M_2^4(x) = x\sqrt{|h^2 - x^2|}$ $N_2^5(x) = \sqrt{|h^2 - x^2|} \sqrt{|x^2 - k^2|}$ $n = 2$ $K_3^1(x) = x^3 - \frac{x}{5}\left[2(b^2 + c^2) - \sqrt{4(b^2 + c^2)^2 - 15b^2 c^2}\right]$ $K_3^2(x) = x^3 - \frac{x}{5}\left[2(b^2 + c^2) + \sqrt{4(b^2 + c^2)^2 - 15b^2 c^2}\right]$ $L_3^3(x) = \sqrt{|x^2 - k^2|}\left[x^2 - \frac{1}{5}\left(b^2 + 2c^2 - \sqrt{(b^2 + 2c^2)^2 - 5b^2 c^2}\right)\right]$ $L_3^4(x) = \sqrt{|x^2 - k^2|}\left[x^2 - \frac{1}{5}\left(b^2 + 2c^2 + \sqrt{(b^2 + 2c^2)^2 - 5b^2 c^2}\right)\right]$ $M_3^5(x) = \sqrt{|h^2 - x^2|}\left[x^2 - \frac{1}{5}\left(2b^2 + c^2 - \sqrt{(2b^2 + c^2)^2 - 5b^2 c^2}\right)\right]$ $M_3^6(x) = \sqrt{|h^2 - x^2|}\left[x^2 - \frac{1}{5}\left(2b^2 + c^2 + \sqrt{(2b^2 + c^2)^2 - 5b^2 c^2}\right)\right]$ $N_3^7(x) = x\sqrt{|h^2 - x^2|} \sqrt{|x^2 - k^2|}$ $n = 3$ when n=0 or n=1, the matrix algorithm for Lamé function construction correctly provides the identity vector as an eigenvalue, considering the form of $\psi_n^p(\lambda_i)$. This also occurs if n=1, for functions $L_2^3(x)$, $M_2^4(x)$ and $N_2^5(x)$. With n=3 and n=2, a comparison was performed, for functions $K_2^1(x)$ and $K_2^2(x)$, between the values assumed in the 2D grid of points in the ellipsoidal space of each function, constructed either in matrix form or with the above explicit expressions. The values obtained from the two computation methods are identical and shall be interpreted, like the results obtained with n=0, n=1 and n=2, as a first validation of the Lamé function construction method.

Calculation of Normalization Coefficients $\gamma_n^p$

In the next macrostep, the ellipsoidal harmonic normalization coefficients $\gamma_n^p$ are calculated. As an example, the following table shows the values obtained by applying (0.4) to the points of the 2D ellipsoidal grid up to the order n=3:

| | gr | | | | | | |
|---|---|---|---|---|---|---|---|
| ord. | p = 1 | p = 2 | p = 3 | p = 4 | p = 5 | p = 6 | p = 7 |
| n = 0 | 12.5663 | / | / | / | / | / | / |
| n = 1 | 4.1888 | 1.5708 | 1.5708 | / | / | / | / |
| n = 2 | 8.3776 | 0.1413 | 0.2158 | 0.2158 | 0.5013 | / | / |
| n = 3 | 1.7531 | $1.037 \cdot 10^{-2}$ | 2.3598 | $6.1 \cdot 10^{-3}$ | $5.7 \cdot 10^{-3}$ | 0.8929 | $405 \cdot 10^{-2}$ |

It should be noted that any $\gamma_n^p$ may be expressed in terms of $4\pi$ (see document [3]), e.g., $$\gamma_1^1 \text{ is } \frac{4}{3}\pi, \gamma_1^2 \text{ and } \gamma_1^3 \text{ are } \frac{4}{8}\pi = \frac{\pi}{2} \text{ and } \gamma_2^1 \text{ is } \frac{2}{3} \cdot 4\pi,$$

whereas $\gamma_0^1$ is $4\pi$. Finally, since the calculation of $\gamma_n^p$ is a pure mathematical problem, which is not related to magnetic field sampling, (0.4) may be calculated with a maximum N precision (in this case N=20), in principle different from the calculation of (0.5).

Calculation of Ellipsoidal Harmonics Expansion Coefficients $\alpha_n^p$

Figure 4:
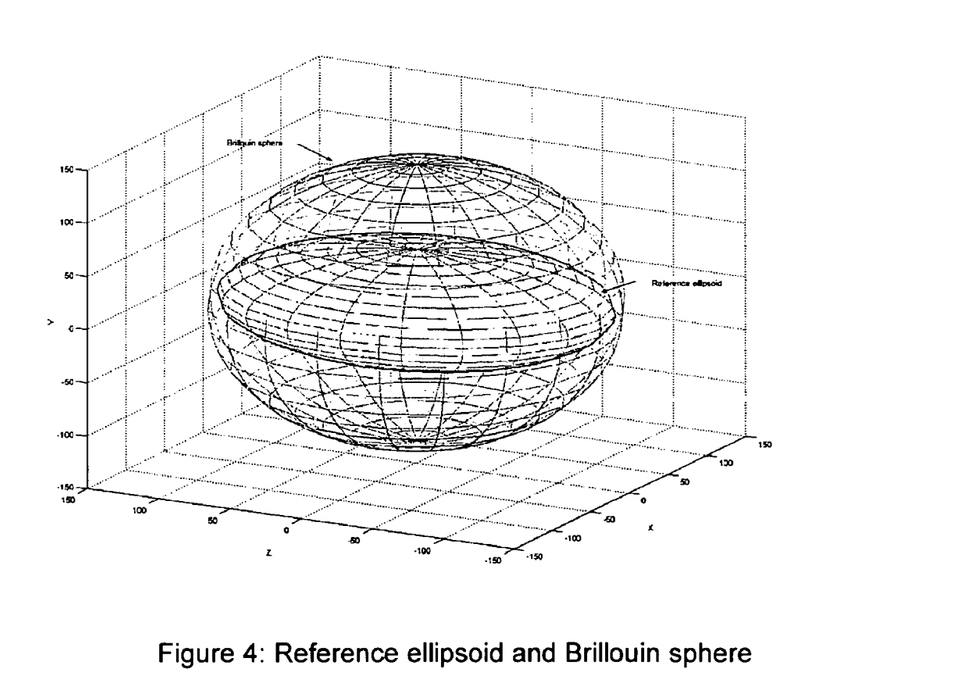
FIG. 4 shows a reference ellipsoid with a Brillouin sphere.

This section will describe a number of test-cases performed on the algorithm for determining the coefficients $\alpha_n^p$, using different measurement file simulations as inputs. In all cases, the ellipsoid considered has the following dimensions:

$a$($x$ semiaxis)=100 mm;

$b$($y$ semiaxis)=50 mm;

$c$($z$ semiaxis)=130 mm;

FIG. 4 shows the diagram of this ellipsoid as well as the comparison with the corresponding Brillouin sphere having radius R=130 mm on the relevant volumes.

By this geometrical configuration, the volume of space in which field shimming would be performed appears to be reduced to 30% of the corresponding spherical volume.

Constant field over the ellipsoid

Using Matlab, a measurement file was generated, which simulated a uniformly constant field over the surface of the ellipsoid. In this case, all output coefficients provided by the algorithm shall be zero, except $\alpha_0^1$, which is the value of the field at the center of the ellipsoid. The results obtained for this case will be shown below, according to the corresponding spherical symmetries (see annex 1 to paragraph 6).

$\alpha_0^1$=10.07750001 Mhz; field at the center=10.07750000 Mhz; difference=$1.1*10^{-8}$ Cosine Coefficients for Even-Even Symmetry

| | | | p | | | |
|---|---|---|---|---|---|---|
| n | 1 | 2 | 3 | 4 | 5 | 6 |
| 2 | 0 | 0 | / | / | / | / |
| 4 | 0 | 0 | 0 | / | / | / |
| 6 | 0 | 0 | 0 | 0 | / | / |
| 8 | 0 | 0 | 0 | 0 | 0 | / |
| 10 | 0 | 0 | 0 | 0 | 0 | 0 |

Sine Coefficients for Even-Even Symmetry

| | | | | p | | | | |
|---|---|---|---|---|---|---|---|---|
| n | 3 | 4 | 5 | 6 | 7 | 8 | 9 | 10 | 11 |
| 2 | 0 | / | / | / | / | / | / | / | / |
| 4 | 0 | 0 | / | / | / | / | / | / | / |
| 6 | / | / | 0 | 0 | 0 | / | / | / | / |
| 8 | / | / | / | 0 | 0 | 0 | 0 | / | / |
| 10 | / | / | / | / | 0 | 0 | 0 | 0 | 0 |

Cosine Coefficients for Even-Odd Symmetry

| | | | | | p | | | | | | | |
|---|---|---|---|---|---|---|---|---|---|---|---|---|
| n | 4 | 6 | 7 | 8 | 9 | 10 | 11 | 12 | 13 | 14 | 15 | 16 |
| 2 | 0 | / | / | / | / | / | / | / | / | / | / | / |
| 4 | / | 0 | 0 | / | / | / | / | / | / | / | / | / |
| 6 | / | / | / | 0 | 0 | 0 | / | / | / | / | / | / |
| 8 | / | / | / | / | / | 0 | 0 | 0 | 0 | / | / | / |
| 10 | / | / | / | / | / | / | / | 0 | 0 | 0 | 0 | 0 |

Sine Coefficients for Even-Odd Symmetry

| | | | | | | p | | | | | | | | |
|---|---|---|---|---|---|---|---|---|---|---|---|---|---|---|
| n | 5 | 8 | 9 | 11 | 12 | 13 | 14 | 15 | 16 | 17 | 18 | 19 | 20 | 21 |
| 2 | 0 | / | / | / | / | / | / | / | / | / | / | / | / | / |
| 4 | / | 0 | 0 | / | / | / | / | / | / | / | / | / | / | / |
| 6 | / | / | / | 0 | 0 | 0 | / | / | / | / | / | / | / | / |
| 8 | / | / | / | / | / | / | 0 | 0 | 0 | 0 | / | / | / | / |
| 10 | / | / | / | / | / | / | / | / | / | 0 | 0 | 0 | 0 | 0 |

Cosine Coefficients for Odd-Odd Symmetry

| | | | p | | | |
|---|---|---|---|---|---|---|
| n | 1 | 2 | 3 | 4 | 5 | 6 |
| 1 | 0 | / | / | / | / | / |
| 3 | 0 | 0 | / | / | / | / |
| 5 | 0 | 0 | 0 | / | / | / |
| 7 | 0 | 0 | 0 | 0 | / | / |
| 9 | 0 | 0 | 0 | 0 | 0 | / |
| 11 | 0 | 0 | 0 | 0 | 0 | 0 |

Sine Coefficients for Odd-Odd Symmetry

| | | | | | p | | | | | | |
|---|---|---|---|---|---|---|---|---|---|---|---|
| n | 2 | 3 | 4 | 5 | 6 | 7 | 8 | 9 | 10 | 11 | 12 |
| 1 | 0 | / | / | / | / | / | / | / | / | / | / |
| 3 | / | 0 | 0 | / | / | / | / | / | / | / | / |
| 5 | / | / | 0 | 0 | 0 | / | / | / | / | / | / |
| 7 | / | / | / | 0 | 0 | 0 | 0 | / | / | / | / |
| 9 | / | / | / | / | 0 | 0 | 0 | 0 | 0 | / | / |
| 11 | / | / | / | / | / | 0 | 0 | 0 | 0 | 0 | 0 |

Cosine Coefficients For Odd-Even Symmetry

| | | | | | | | | p | | | | | | | |
|---|---|---|---|---|---|---|---|---|---|---|---|---|---|---|---|
| n | 3 | 5 | 6 | 7 | 8 | 9 | 10 | 11 | 12 | 13 | 14 | 15 | 16 | 17 | 18 |
| 1 | 0 | / | / | / | / | / | / | / | / | / | / | / | / | / | / |
| 3 | / | 0 | 0 | / | / | / | / | / | / | / | / | / | / | / | / |
| 5 | / | / | / | 0 | 0 | 0 | / | / | / | / | / | / | / | / | / |
| 7 | / | / | / | / | / | 0 | 0 | 0 | 0 | / | / | / | / | / | / |
| 9 | / | / | / | / | / | / | / | 0 | 0 | 0 | 0 | 0 | / | / | / |
| 11 | / | / | / | / | / | / | / | / | / | 0 | 0 | 0 | 0 | 0 | 0 |

Sine Coefficients For Odd-Even Symmetry

| | | | | | | | | p | | | | | |
|---|---|---|---|---|---|---|---|---|---|---|---|---|---|
| n | 7 | 10 | 11 | 13 | 14 | 15 | 16 | 17 | 18 | 19 | 20 | 21 | 22 | 23 |
| 3 | 0 | / | / | / | / | / | / | / | / | / | / | / | / | / |
| 5 | / | 0 | 0 | / | / | / | / | / | / | / | / | / | / | / |
| 7 | / | / | / | 0 | 0 | 0 | / | / | / | / | / | / | / | / |
| 9 | / | / | / | / | / | / | 0 | 0 | 0 | 0 | / | / | / | / |
| 11 | / | / | / | / | / | / | / | / | / | 0 | 0 | 0 | 0 | 0 |

Therefore, the result appears to be consistent with the theory. Expansion is performed up to the order N=11, considering as a measurement file a file with 12 'ellipses' (planes) over the surface of the ellipsoid. The test-cases always relate to a measurement file of this type, which involves sampling of the magnetic field at 576 different points over the ellipsoid. A few considerations and tests will be now proposed with the aim of reducing the sampling points, thence the duration of each measurement.

Figure 5:
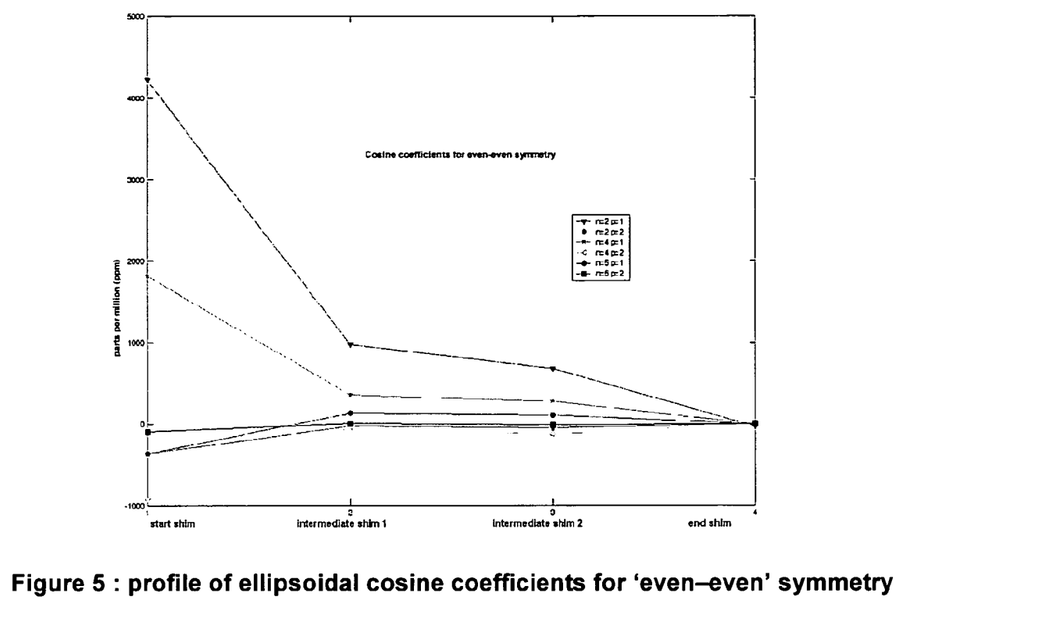
FIG. 5 shows the profile of ellipsoidal cosine coefficients with 'even-even' symmetry
Figure 6:
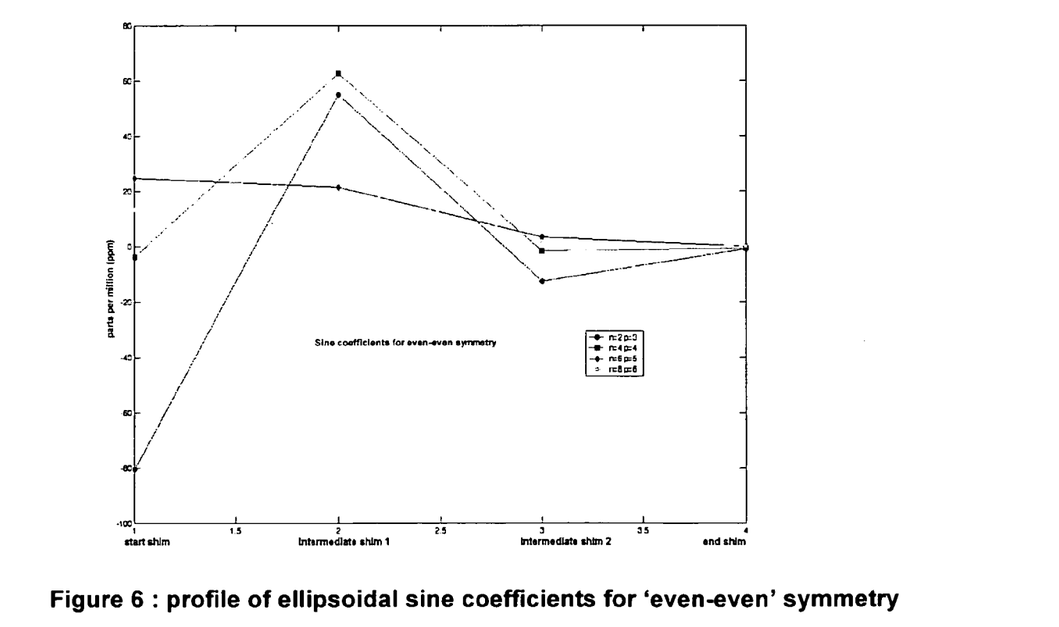
FIG. 6 shows the profile of ellipsoidal sine coefficients with 'even-even symmetry'.

The diagrams of FIGS. 5 and 6 show the profiles of a few ellipsoidal coefficients for two spherical symmetries (see previous paragraph), through four distinct field shimming steps, denoted as start shim, intermediate shim 1, intermediate shim 2 and end shim.

The measurement files were obtained, using Matlab, from four field developments in spherical harmonics, on the basis of four actual measurements over a sphere having a radius r=125 mm, in four distinct shimming steps on a magnet (in this specific case, a MRI apparatus called G-Scan, manufactured by Esaote S.p.A.).

Similar profiles are obtained for all the other coefficients (i.e. for the other symmetries), and this result proves that the algorithm can correctly follow the shimming profile as field uniformity (i.e. its 'convergence' to the ideal constant field over the ellipsoid) increases, and further confirms proper construction of ellipsoidal harmonics (and thence of the series of functions that represent the field development) even for orders n>3.

Ellipsoidal Expansion from an Actual Measurement over an Ellipsoid

The development of an actual measurement over an ellipsoid having dimensions a=100 mm, b=50 mm; c=130 mm will be now described, in association with a magnet as that used in the MRI apparatus G-Scan, manufactured by Esaote S.p.A., in an intermediate shimming step. This measurement is important both because it is the first expansion in ellipsoidal coefficients that is performed on actual experimental data and because it is taken as a starting point for the test that will be described in the next paragraph about the reconstruction of the magnetic field from the ellipsoidal coefficients. The coefficients are listed by spherical symmetries, like in the previous paragraph, and are compared with those resulting from a measurement over a sphere having a radius r=125 mm in the same shimming conditions.

Cosine Coefficients for Even-Even Symmetry (Ellipsoid)

| | p | | | | | |
|---|---|---|---|---|---|---|
| n | 1 | 2 | 3 | 4 | 5 | 6 |
| 2 | 917 | −70 | / | / | / | / |
| 4 | 410 | −185 | −0.014 | / | / | / |
| 6 | 166 | −19 | −0.2 | 0 | / | / |
| 8 | 68 | −2 | −0.2 | 0 | 0 | / |
| 10 | 27 | 0 | −0.4 | −0.03 | 0.1 | 0.4 |

Cosine Coefficients for Even-Even Symmetry (Sphere)

| | m | | | | | |
|---|---|---|---|---|---|---|
| l | 0 | 2 | 4 | 6 | 8 | 10 |
| 2 | 1612 | 6.1 | / | / | / | / |
| 4 | −216 | −0.04 | −4.9 | / | / | / |
| 6 | −367 | −7.5 | 6.3 | −0.6 | / | / |
| 8 | −121 | 1.9 | −3.8 | 1.7 | 1.2 | / |
| 10 | 56 | 1.2 | 2.1 | 1.1 | 0.2 | 0.8 |

Sine Coefficients for Even-Even Symmetry (Ellipsoid)

| | p | | | | | | | | |
|---|---|---|---|---|---|---|---|---|---|
| n | 3 | 4 | 5 | 6 | 7 | 8 | 9 | 10 | 11 |
| 2 | −11 | / | / | / | / | / | / | / | / |
| 4 | / | 4.7 | −0.2 | / | / | / | / | / | / |
| 6 | / | / | 6.9 | −0.7 | 0 | / | / | / | / |
| 8 | / | / | / | 3.1 | −0.4 | 0.03 | 0 | / | / |
| 10 | / | / | / | / | 1.2 | −0.1 | 0.1 | 0 | 0.02 |

Sine Coefficients for Even-Even Symmetry (Sphere)

| | m | | | | |
|---|---|---|---|---|---|
| l | 2 | 4 | 6 | 8 | 10 |
| 2 | 2 | / | / | / | / |
| 4 | 1.2 | 0.03 | / | / | / |

-continued

| | | m | | | |
|---|---|---|---|---|---|
| l | 2 | 4 | 6 | 8 | 10 |
| 6 | 0.7 | −1.5 | −1.3 | / | / |
| 8 | −1.5 | 0.1 | −0.8 | 0.1 | / |
| 10 | −2.2 | −1.8 | −1.3 | 1.8 | 0.8 |

Cosine Coefficients for Even-Odd Symmetry (Ellipsoid)

| | | | | | p | | | | | |
|---|---|---|---|---|---|---|---|---|---|---|
| n | 4 | 6 | 7 | 8 | 9 | 10 | 11 | 12 | 13 | 14 | 15 | 16 |
| 2 | −11.3 | / | / | / | / | / | / | / | / | / | / | / |
| 4 | / | 4.9 | 0 | / | / | / | / | / | / | / | / | / |
| 6 | / | / | / | 3.2 | −0.2 | 0 | / | / | / | / | / | / |
| 8 | / | / | / | / | / | 1.3 | −0.1 | 0 | 0 | / | / | / |
| 10 | / | / | / | / | / | / | / | 0.5 | 0 | 0 | 0 | 0 |

Cosine Coefficients for Even-Odd Symmetry (Sphere)

| | | m | | | |
|---|---|---|---|---|---|
| l | 1 | 3 | 5 | 7 | 9 |
| 2 | 42 | / | / | / | / |
| 4 | −8.8 | 1.1 | / | / | / |
| 6 | −5.0 | −0.4 | −2.3 | / | / |
| 8 | −3.0 | 1.5 | −0.5 | −0.4 | / |
| 10 | 3.7 | 3.2 | −0.1 | 1.4 | −1.1 |

Sine Coefficients for Even-Odd Symmetry (Ellipsoid)

| | | | | | | p | | | | | | | |
|---|---|---|---|---|---|---|---|---|---|---|---|---|---|
| n | 5 | 8 | 9 | 11 | 12 | 13 | 14 | 15 | 16 | 17 | 18 | 19 | 20 | 21 |
| 2 | 101 | / | / | / | / | / | / | / | / | / | / | / | / | / |
| 4 | / | −0.2 | 127 | / | / | / | / | / | / | / | / | / | / | / |
| 6 | / | / | / | 0.01 | −0.6 | 69 | / | / | / | / | / | / | / | / |
| 8 | / | / | / | / | / | / | 0 | 0 | −0.2 | 32 | / | / | / | / |
| 10 | / | / | / | / | / | / | / | / | / | 0.04 | 0.1 | 14 | 0 | 0.07 |

Sine Coefficients for Even-Odd Symmetry (Sphere)

| | | m | | | |
|---|---|---|---|---|---|
| l | 1 | 3 | 5 | 7 | 9 |
| 2 | 52 | / | / | / | / |
| 4 | −4.8 | −0.06 | / | / | / |
| 6 | −1.8 | −0.5 | −0.05 | / | / |
| 8 | −0.1 | 0.05 | −3.1 | −0.3 | / |
| 10 | 1.6 | −1.2 | −2.9 | 0.5 | −1.1 |

Cosine Coefficients for Odd-Odd Symmetry (Ellipsoid)

| | | p | | | |
|---|---|---|---|---|---|
| n | 1 | 2 | 3 | 4 | 5 |
| 1 | −1259 | / | / | / | / |
| 3 | −321 | −2.2 | / | / | / |
| 5 | 3.8 | −14 | 0 | / | / |
| 7 | 4.9 | −4.4 | 0 | 0 | / |
| 9 | 1.9 | −0.3 | 0 | 0 | 0 |

Cosine Coefficients for Odd-Odd Symmetry (Sphere)

| | | m | | | |
|---|---|---|---|---|---|
| l | 1 | 3 | 5 | 7 | 9 |
| 1 | 50 | / | / | / | / |
| 3 | −22 | 2 | / | / | / |
| 5 | −12 | −6.3 | −0.4 | / | / |
| 7 | −2.5 | −2.7 | 0.1 | −0.4 | / |
| 9 | 1.7 | 1.4 | −0.6 | 0.8 | −0.1 |

Sine Coefficients for Odd-Odd Symmetry (Ellipsoid)

| | | | | | p | | | | | |
|---|---|---|---|---|---|---|---|---|---|---|
| n | 2 | 3 | 4 | 5 | 6 | 7 | 8 | 9 | 10 |
| 1 | 272 | / | / | / | / | / | / | / | / |
| 3 | / | 476 | −2 | / | / | / | / | / | / |

-continued

| | | | | | p | | | | | |
|---|---|---|---|---|---|---|---|---|---|---|
| n | 2 | 3 | 4 | 5 | 6 | 7 | 8 | 9 | 10 |
| 5 | / | / | 246 | −7 | 0 | / | / | / | / |
| 7 | / | / | / | 105 | −3.1 | 0 | 0 | / | / |
| 9 | / | / | / | / | 43 | −0.7 | 0 | 0 | 0 |

Sine Coefficients for Odd-Odd Symmetry (Sphere)

| | m | | | | |
|---|---|---|---|---|---|
| l | 1 | 3 | 5 | 7 | 9 |
| 1 | −360 | / | / | / | / |
| 3 | 19 | −77 | / | / | / |
| 5 | −13 | 7 | 6 | / | / |
| 7 | 14 | 5 | 0.6 | −0.1 | / |
| 9 | −4.5 | −0.2 | −4.0 | 0.7 | 0.4 |
| 1 | −360 | / | / | / | / |
| 3 | 19 | −77 | / | / | / |
| 5 | −13 | 7 | 6 | / | / |
| 7 | 14 | 5 | 0.6 | −0.1 | / |
| 9 | −4.5 | −0.2 | −4.0 | 0.7 | 0.4 |

Cosine Coefficients for Odd-Even Symmetry (Ellipsoid)

| | p | | | | | | | | | | | |
|---|---|---|---|---|---|---|---|---|---|---|---|---|
| n | 3 | 5 | 6 | 7 | 8 | 9 | 10 | 11 | 12 | 13 | 14 | 15 |
| 1 | 272 | / | / | / | / | / | / | / | / | / | / | / |
| 3 | / | −2 | 189 | / | / | / | / | / | / | / | / | / |
| 5 | / | / | / | 0 | −3 | 100 | / | / | / | / | / | / |
| 7 | / | / | / | / | / | 0 | 0 | −0.6 | 47 | / | / | / |
| 9 | / | / | / | / | / | / | / | 0 | 21 | 0 | 0 | −0.1 |

Cosine Coefficients for Odd-Even Symmetry (Sphere)

| | m | | | | |
|---|---|---|---|---|---|
| l | 0 | 2 | 4 | 6 | 8 |
| 1 | −19 | / | / | / | / |
| 3 | −38 | −18 | / | / | / |
| 5 | −6 | −2 | 1.2 | / | / |
| 7 | −2.4 | −0.3 | −2.1 | 0.7 | / |
| 9 | 3.8 | 1.1 | −3.5 | 2.6 | 0.5 |

Sine Coefficients for Odd-Even Symmetry (Ellipsoid)

| | p | | | | | | | | | |
|---|---|---|---|---|---|---|---|---|---|---|
| n | 7 | 10 | 11 | 13 | 14 | 15 | 16 | 17 | 18 | 19 |
| 3 | 2.2 | / | / | / | / | / | / | / | / | / |
| 5 | / | 3.9 | 0 | / | / | / | / | / | / | / |
| 7 | / | / | / | 2.1 | 0 | 0 | / | / | / | / |
| 9 | / | / | / | / | / | / | 0.8 | 0 | 0 | 0 |

Sine Coefficients for Odd-Even Symmetry (Sphere)

| | m | | | |
|---|---|---|---|---|
| l | 2 | 4 | 6 | 8 |
| 3 | −5.8 | / | / | / |
| 5 | 1.3 | −0.8 | / | / |
| 7 | −0.1 | −2.1 | −0.8 | / |
| 9 | −2.2 | −0.3 | −1.3 | 0.03 |

Obviously, both the total number of coefficients and the number of coefficients per each symmetry coincide, thanks to the properties of the base transformation of orthonormal functions (i.e. from spherical functions to ellipsoidal functions), as described in annex 1. Basically, although two different surfaces are considered, it is just like using two 'dialects' (of two neighboring regions) of one mother tongue (i.e. the same physical phenomenon).

Reconstruction of the Magnetic Field from the Ellipsoidal Harmonic Expansion

Once the quantities $\alpha_n^p$ have been determined, it is possible to reconstruct the actual magnetic field from which they were obtained over the whole 3D Cartesian grid, by using (0.3), and compare the result obtained with the experimental value. It shall be noted that the $\alpha_n^p$ considered for field reconstruction are not those expressed in ppm and normalized by the $\gamma_n^p$ as set out in the previous sub-paragraphs. The average differences, expressed in ppm, for the four measurements simulated and described in the previous paragraphs, relating to simulated measurement and actual measurement, are set out below. For proper interpretation of these somewhat 'unexpected' results, these values were compared with those obtained considering field reconstruction, for the case of the sphere, from the same expansions in spherical coefficients that were used above.

| measurement/difference | ellipsoid (ppm) | sphere (ppm) |
|---|---|---|
| Start shim | 3 | 2.5 |
| Intermediate shim 1 | 2 | 1.8 |
| Intermediate shim 2 | 1.4 | 1.5 |
| End shim | 0.7 | 1 |
| Measurement at point 4.3.3 | 2.1 | 1.9 |

As shown in this table, field reconstruction from ellipsoidal coefficients has a degree of accuracy that is consistent with the results obtained in the sphere case and substantially reflects one of the characteristics of the numerical technique (Gauss) that was used to determine the coefficients, regardless of its being applied in the 'sphere' or 'ellipsoid' case. The following table shows, for each measurement, the standard deviation from the mean calculated from the observed values, contained in measurement files, both for the sphere case and for the actual measurement performed over the ellipsoid, as a data 'scattering' parameter:

| measurement (sphere) | Standard deviation (MHz) |
|---|---|
| Start shim | $2 \cdot 10^{-2}$ |
| Intermediate shim 1 | $8.3 \cdot 10^{-3}$ |
| Intermediate shim 2 | $1.9 \cdot 10^{-3}$ |
| End shim | $1.3 \cdot 10^{-4}$ |
| Measurement (ellipsoid) | $9.6 \cdot 10^{-3}$ |

The data in this table shows that the Gauss method that was used for numerical determination of either spherical or ellipsoidal harmonic expansion coefficients is particularly sensitive to distribution ('scattering') of data around the mean value, although we can state that this dependency is "weak" and in any case the precision and the stability shown by the algorithm allows its use for carrying out a real shimming of the magnetic field. Thus, from a comparison with the sphere case, field reconstruction by using ellipsoidal coefficients may be considered 'acceptable' according to the above mentioned parameters.

Cosine Coefficients for Even-Odd Symmetry

| | p | | | | | | | | | | | |
|---|---|---|---|---|---|---|---|---|---|---|---|---|
| n | 4 | 6 | 7 | 8 | 9 | 10 | 11 | 12 | 13 | 14 | 15 | 16 |
| 2 | −10.1 | / | / | / | / | / | / | / | / | / | / | / |
| 4 | / | 5.3 | 0 | / | / | / | / | / | / | / | / | / |
| 6 | / | / | / | 3.4 | −0.2 | 0 | / | / | / | / | / | / |
| 8 | / | / | / | / | / | 1.4 | −0.1 | 0 | 0 | / | / | / |
| 10 | / | / | / | / | / | / | / | 0.5 | 0 | 0 | 0 | 0 |

Sine Coefficients for Even-Odd Symmetry

| | p | | | | | | | | | | | | | |
|---|---|---|---|---|---|---|---|---|---|---|---|---|---|---|
| n | 5 | 8 | 9 | 11 | 12 | 13 | 14 | 15 | 16 | 17 | 18 | 19 | 20 | 21 |
| 2 | 105 | / | / | / | / | / | / | / | / | / | / | / | / | / |
| 4 | / | −0.2 | 131 | / | / | / | / | / | / | / | / | / | / | / |
| 6 | / | / | / | 0.01 | −0.6 | 71 | / | / | / | / | / | / | / | / |
| 8 | / | / | / | / | / | / | 0 | 0 | −0.2 | 33 | / | / | / | / |
| 10 | / | / | / | / | / | / | / | / | / | 0.01 | 0.1 | 14 | 0 | 0.07 |

Sampling Point Reduction Test

The numerical results of the algorithm, as described in the previous paragraphs, refer to a measurement file containing 576 experimental points whereat the magnetic field was sampled. These points are divided into 12 'ellipses' lying on the ellipsoid, each being formed by 48 experimental points. With the final purpose of optimizing the duration of each measurement, an actual measurement was performed with half as many sampling points, i.e. 288 points divided into 12 'ellipses' each having 24 points. The following tables define the ellipsoidal expansion deriving from such measurement, which has to be compared with that obtained in the previous paragraph, relating to the ellipsoidal expansion from an actual measurement over an ellipsoid:

Cosine Coefficients for Even-Even Symmetry

| | p | | | | | |
|---|---|---|---|---|---|---|
| n | 1 | 2 | 3 | 4 | 5 | 6 |
| 2 | 957 | −70 | / | / | / | / |
| 4 | 426 | −182 | −0.014 | / | / | / |
| 6 | 171 | −19 | −0.2 | 0 | / | / |
| 8 | 70 | −2 | −0.2 | 0 | 0 | / |
| 10 | 28 | 0 | −0.4 | −0.03 | 0.1 | 0.4 |

Sine Coefficients for Even-Even Symmetry

| | p | | | | | | | | |
|---|---|---|---|---|---|---|---|---|---|
| n | 3 | 4 | 5 | 6 | 7 | 8 | 9 | 10 | 11 |
| 2 | −10 | / | / | / | / | / | / | / | / |
| 4 | / | 5.7 | −0.2 | / | / | / | / | / | / |
| 6 | / | / | 7.2 | −0.7 | 0 | / | / | / | / |
| 8 | / | / | / | 3.2 | −0.4 | 0.03 | 0 | / | / |
| 10 | / | / | / | / | 1.2 | −0.1 | 0.1 | 0 | 0.02 |

Cosine Coefficients for Odd-Odd Symmetry

| | p | | | | | |
|---|---|---|---|---|---|---|
| n | 1 | 2 | 3 | 4 | 5 | 6 |
| 1 | −1216 | / | / | / | / | / |
| 3 | −311 | −2.2 | / | / | / | / |
| 5 | 5.8 | −14 | 0 | / | / | / |
| 7 | 5.2 | −4.4 | 0 | 0 | / | / |
| 9 | 2 | −0.3 | 0 | 0.014 | 0 | / |

Sine Coefficients for Odd-Odd Symmetry

| | p | | | | | | | | | | |
|---|---|---|---|---|---|---|---|---|---|---|---|
| n | 2 | 3 | 4 | 5 | 6 | 7 | 8 | 9 | 10 | 11 | 12 |
| 1 | 286 | / | / | / | / | / | / | / | / | / | / |
| 3 | / | 494 | −2 | / | / | / | / | / | / | / | / |
| 5 | / | / | 255 | −7 | 0 | / | / | / | / | / | / |
| 7 | / | / | / | 108 | −3.1 | 0 | 0 | / | / | / | / |
| 9 | / | / | / | / | 44 | −0.7 | 0 | 0 | 0 | / | / |

Cosine Coefficients for Odd-Even Symmetry

| | | | | | | | p | | | | | | | | |
|---|---|---|---|---|---|---|---|---|---|---|---|---|---|---|---|
| n | 3 | 5 | 6 | 7 | 8 | 9 | 10 | 11 | 12 | 13 | 14 | 15 | 16 | 17 | 18 |
| 1 | 286 | / | / | / | / | / | / | / | / | / | / | / | / | / | / |
| 3 | / | -2 | 195 | / | / | / | / | / | / | / | / | / | / | / | / |
| 5 | / | / | / | 0 | -3 | 104 | / | / | / | / | / | / | / | / | / |
| 7 | / | / | / | / | / | 0 | 0 | -0.6 | 49 | / | / | / | / | / | / |
| 9 | / | / | / | / | / | / | / | 0 | 22 | 0 | 0 | -0.1 | / | / | / |

Sine Coefficients for Odd-Even Symmetry

| | | | | | | | p | | | | | | | |
|---|---|---|---|---|---|---|---|---|---|---|---|---|---|---|
| n | 7 | 10 | 11 | 13 | 14 | 15 | 16 | 17 | 18 | 19 | 20 | 21 | 22 | 23 |
| 3 | 2.6 | / | / | / | / | / | / | / | / | / | / | / | / | / |
| 5 | / | 4.2 | 0 | / | / | / | / | / | / | / | / | / | / | / |
| 7 | / | / | / | 2.2 | 0 | 0 | / | / | / | / | / | / | / | / |
| 9 | / | / | / | / | / | / | 0.8 | 0 | 0 | 0 | / | / | / | / |

The expansion obtained thereby is consistent with that described in the previous paragraph, which was obtained by using twice as many sampling points. This result, which is 'expected' on the basis of the theory of ellipsoidal harmonics and their representation in spherical harmonics (see The Theory of Spherical and Ellipsoidal Harmonics, Hobson E. W., Cambridge University Press, 1996), confirms the possibility of performing measurements with half as many sampling points, thence in half as long time. A further confirmation of the validity of this result may be obtained by comparing the maximum error committed in both cases, in field reconstruction as described in the previous paragraph, which is shown in the following table:

| measurement/difference | ppm |
|---|---|
| Measurement with 576 points | 3 |
| Measurement with 288 points | 3.2 |

Eventually, the resulting average difference is consistent with that is obtained with a more intensive magnetic field sampling, which further confirms the possibility of reducing the number of experimental points on which the magnetic field is sampled.

Indeed in the described algorithm it is also possible to consider a 3D grid of points which is formed by 11 "ellipses" positioned on the ellipsoid and defining a total of 266 sampled points which grid shows a degree of precision which is consistent with the case of 288 points.

Algorithm Execution Times

The time to determine the coefficients by the algorithm as described above is in any case, i.e. for any order N of expansion development, below 30 seconds in a computer having an average hardware configuration.

The above description showed the results of a set of tests on the algorithm for expansion of the magnetic field in ellipsoidal harmonics. The resulting numerical properties and data generally confirm the validity and correctness of the algorithm and are always consistent with those obtained in the more familiar case of the sphere. This algorithm may be used as a future ellipsoidal shimming instrument. Besides allowing integration of the software with the general coefficient calculation program, the algorithm described as an application of the inventive method allows to determine new specially designed magnet structures, adapted to contain a homogeneous magnetic field which permeates an ellipsoidal volume of space and is delimited by an ideal delimiting ellipsoid and is shimmed over an ellipsoid.

Annex 1

Solution of Laplace's Equation with Boundary Conditions over an Ellipsoid

1. Definition of Ellipsoidal Coordinates

The ellipsoidal coordinates may be associated to the Cartesian coordinates in various manners. They are defined with respect to the fundamental ellipsoid, whose center is in the origin with semiaxes a, b, c, described in equation:

$$\frac{x^2}{a^2} + \frac{y^2}{b^2} + \frac{z^2}{c^2} = 1 \tag{0.9}$$

A set of confocal quadrics may be defined from this reference ellipsoid:

$$\frac{x^2}{a^2+\theta^2} + \frac{y^2}{b^2+\theta^2} + \frac{z^2}{c^2+\theta^2} = 1 \tag{0.10}$$

and by introducing the parameters $$\lambda^2 = a^2 + \theta^2$$

$$h^2 = a^2 - b^2$$

$$k^2 = a^2 - c^2 \tag{0.11}$$

the equation (0.10) may be rewritten as follows:

$$\frac{x^2}{\lambda^2} + \frac{y^2}{\lambda^2 - h^2} + \frac{z^2}{\lambda^2 - k^2} = 1 \tag{0.12}$$

the advantage of (0.12) is that the family of confocal quadrics is directly related to the fundamental ellipsoid and is wholly characterized by two parameters h and k.

By setting a point p(x,y,z) the equation (0.12) has three roots $\lambda_1, \lambda_2, \lambda_3$ which satisfy the chain of inequalities:

$$\lambda^2_1 > k^2 > \lambda_2^2 > h^2 > \lambda_3^2$$

the set of values $(\lambda_1, \lambda_2, \lambda_3)$ is orthogonal and is called set of ellipsoidal coordinates.

The cartesian coordinates are related to the ellipsoidal coordinates as defined above by the following transformations:

$$x^2 = \frac{\lambda_1^2 \lambda_2^2 \lambda_3^2}{h^2 k^2} \quad (0.13)$$

$$y^2 = \frac{(\lambda_1^2 - h^2)(\lambda_2^2 - h^2)(h^2 - \lambda_3^2)}{h^2(k^2 - h^2)}$$

$$z^2 = \frac{(\lambda_1^2 - k^2)(k^2 - \lambda_2^2)(k^2 - \lambda_3^2)}{k^2(k^2 - h^2)}$$

Finally, if the following transformation is introduced:

$$\cos\vartheta = \frac{\lambda_2 \lambda_3}{hk}$$

$$\sin\vartheta \cos\varphi = \frac{\sqrt{\lambda_2^2 - h^2}\sqrt{h^2 - \lambda_3^2}}{h\sqrt{k^2 - h^2}}$$

$$\sin\vartheta \sin\varphi = \frac{\sqrt{k^2 - \lambda_2^2}\sqrt{k^2 - \lambda_3^2}}{k\sqrt{k^2 - h^2}}$$

where $0 \leq \vartheta \leq \pi$ and $0 \leq \varphi < 2\pi$, the following will be obtained:

$$x = \lambda_i \cos\theta$$

$$y = \sqrt{\lambda_1^2 - h^2} \sin\theta \cos\phi$$

$$z = \sqrt{\lambda_1^2 - k^2} \sin\theta \sin\phi$$

where the analogy shows that $\lambda_1$ may be reinterpreted as a sort of "radius" of the ellipsoid. Paragraph 4 will confirm this analogy between spherical and ellipsoidal coordinates.

2. Laplace's Equation in Ellipsoidal Coordinates

In the set of ellipsoidal coordinates as defined in paragraph 1, the Laplace's equation $$\nabla^2 V = 0 \quad (0.14)$$

may be rewritten as follows $$\sum_{\substack{i=1 \\ j<k \\ j \neq i \\ k \neq i}}^{3} (\lambda_j^2 - \lambda_k^2)\sqrt{(\lambda_i^2 - h^2)(\lambda_i^2 - k^2)}\, \frac{\partial}{\partial \lambda_i}\left(\sqrt{(\lambda_i^2 - h^2)(\lambda_i^2 - k^2)}\, \frac{\partial V}{\partial \lambda_i}\right) = 0 \quad (0.15)$$

If the equation has to be solved by separations of variables of the following type:

$$V(\lambda_1, \lambda_2, \lambda_3) = \prod_{i=1}^{3} X_i(\lambda_i)$$

then the equation (0.15) may be separated into three differential equations as follows:

$$(\lambda_i^2 - h^2)(\lambda_i^2 - k^2)\frac{d^2 X_i}{d\lambda_i^2} + \lambda_i(2\lambda_i^2 - k^2 - h^2)\frac{dX_i}{d\lambda_i} + (K - H\lambda_i^2)X_i = 0 \quad (0.16)$$

which contain one ellipsoidal coordinate at a time. These equations are known as Lamé equations. The parameters H and K may be selected in such a manner that a solution to the equation (0.16) may have the following general form:

$$E_n^p(\lambda) = \psi(\lambda)P(\lambda) \quad (0.17)$$

where P is a polynomial in $\lambda^2$ and $\psi$ is as follows:

$$\psi_{u,v,w}(\lambda) = \lambda^u \sqrt{|\lambda^2 - h^2|}^v \sqrt{|\lambda^2 - k^2|}^w \quad (0.18)$$

with u, v, w that can be either 0 or 1.

The function defined in the equation (0.17) is known as Lamé function (or ellipsoidal harmonic) of the first kind, where the index n denotes the highest degree of $\lambda$ and p can vary from 1 to 2n+1. As defined in the equation (0.18), there are four different types of Lamé functions of the first kind, depending on the values of u,v,w, which are denoted by K, L, M and N. More specifically:

1. $u=v=w=0 \rightarrow \psi=1$ said $K_n^p(\lambda)$ with $P(\lambda)$ of degree n.
2. $u=1$ $v=1$ $w=0 \rightarrow \psi = \sqrt{|\lambda^2 - h^2|}$ said $L_n^p(\lambda)$ with $P(\lambda)$ of degree n−1.
3. $u=0$ $v=0$ $w=1 \rightarrow \psi = \sqrt{|\lambda^2 - k^2|}$ said $M_n^p(\lambda)$ with $P(\lambda)$ of degree n−1.
4. $u=v=w=1 \rightarrow \psi = \lambda\sqrt{|\lambda^2 - k^2|}\sqrt{|\lambda^2 - h^2|}$ said $N_n^p(\lambda)$ with $P(\lambda)$ of degree n−2.

A Lamé function of the second kind can be also defined, because a solution to the Laplace's equation as follows:

$$V(\lambda_1, \lambda_2, \lambda_3) = E_n^p(\lambda_1)E_n^p(\lambda_2)E_n^p(\lambda_3) \quad (0.19)$$

is not appropriate to describe the potential at large distances, as it diverges for $\lambda_1 \to \infty$.

Lamé functions of the second kind are defined from Lamé functions of the first kind, as follows:

$$F_n^p(\lambda_1) = (2n+1)E_n^p(\lambda_1) \cdot \int_{\lambda_1}^{\infty} \frac{du}{(E_n^p(u))^2 \sqrt{(u^2 - k^2)(u^2 - h^2)}} \quad (0.20)$$

so that $F_n^p(\lambda_1) \to 0$ for $\lambda_1 \to \infty$.

Therefore, generally, once the index n has been set and said $\sigma = n/2$, when n is even or $\sigma = n/2$ when n is odd, there will be:

$\sigma+1$ functions of type K with $p=1 \ldots \sigma+1$;
$n-\sigma$ functions of type L with $p=\sigma+2 \ldots n+1$;
$n-\sigma$ functions of type N with $p=n+2 \ldots 2n-\sigma+1$;
$\sigma$ functions of type N with $p=2n-\sigma+2 \ldots 2n+1$;

Paragraph 8 will explain in greater detail the form of Lamé functions, and will show explicit calculations for certain orders.

3. Solution of the Laplace'S Equation in Ellipsoidal Harmonics

As a result of what has been defined in paragraphs 1 and 2, the solution of the Laplace's equation may be now written in terms of ellipsoidal harmonic expansion, as follows:

$$V(\lambda_1, \lambda_2, \lambda_3) = \sum_{n=0}^{\infty} \sum_{p=1}^{2n+1} \alpha_{np} \frac{E_n^p(\lambda_1)}{E_n^p(\lambda_1^{ref})} \cdot E_n^p(\lambda_2)E_n^p(\lambda_3) \quad (0.21)$$

for $\lambda_1 \leq \lambda_1^{ref}$ and

-continued $$V(\lambda_1, \lambda_2, \lambda_3) = \sum_{n=0}^{\infty} \sum_{p=1}^{2n+1} \alpha_{np} \frac{F_n^p(\lambda_1)}{F_n^p(\lambda_1^{ref})} \cdot E_n^p(\lambda_2) E_n^p(\lambda_3) \qquad (0.22)$$

for $\lambda_1 \geq \lambda_1^{ref}$, where $\alpha_{np}$ has been introduced, representing the ellipsoidal harmonic expansion coefficients. Over the ellipsoid $\lambda_1 = \lambda_1^{ref}$, the two previous expressions are identical, hence the potential is a continuous function all over the space.

4. Analogy between Ellipsoidal and Spherical Harmonics

A strong analogy exists between the spherical harmonics and the ellipsoidal harmonics, the former typically having indexes (l, m) and the latter having, as shown above, indexes (n, p). For a given l=n, there are (2l+1) spherical harmonics and an identical number of ellipsoidal harmonics. Also, each spherical harmonic may be rewritten in terms of a development of (finite) sets of ellipsoidal harmonics of the following type:

$$P_{lm}(\cos\theta)\cos(m\phi) = \Sigma \alpha E(\lambda_2) E(\lambda_3)$$

and the same applies for sine, where $\alpha$ denotes appropriate constants. Finally, as mentioned in paragraphs 1 and 2, $\lambda_1$ substantially defines the 'radius' of the ellipsoid and governs its profile at the origin and infinity, thereby completing the analogy between the two coordinate systems and the two family of harmonics.

5. Passage from Ellipsoidal Harmonics to Spherical Harmonics

By virtue of the strict analogy between ellipsoidal harmonics and spherical harmonics, it may be useful to find a possible transformation which allows to map the coefficients $\alpha_n^p$ into coefficients of a spherical harmonic expansion over a given ellipsoid-specific sphere, known as Brillouin sphere. Paragraph 7 discusses the properties of the Brillouin sphere, and its use for the above purposes, in greater detail.

The Lamé functions of the first kind prove to satisfy the following relation:

$$\int_E \int_{\lambda_1} \frac{E_n^p(\lambda_2) E_n^p(\lambda_3) E_{n'}^{p'}(\lambda_2) E_{n'}^{p'}(\lambda_3)}{\sqrt{(\lambda_1^2 - \lambda_3^2)(\lambda_1^2 - \lambda_2^2)}} dS = 0 \qquad (0.23)$$

if $n \neq n'$ and $p \neq p'$, otherwise the integral (0.23) is equal to a certain value, that can be denoted by $\gamma_n^p$ the integration is over the surface (ellipsoid) at $\lambda_1$=cost. Now, if (0.23) is applied to both sides of (0.21), the coefficients of ellipsoid harmonic expansion may be extrapolated. Therefore the following may be obtained:

$$\alpha_{np} = \frac{1}{\gamma_n^p} \frac{E_n^p(\lambda_1^{ref})}{E_n^p(\lambda_1)} \int_E \int_{\lambda_1} \frac{V(\lambda_1, \lambda_2, \lambda_3)}{\sqrt{(\lambda_1^2 - \lambda_2^2)(\lambda_1^2 - \lambda_3^2)}} \cdot E_n^p(\lambda_2) E_n^p(\lambda_3) dS \qquad (0.24)$$

Thus, once the potential over the surface is known, it is possible to calculate the coefficients of ellipsoidal harmonic expansion.

Once these coefficients have been determined, it may be convenient is to express (map) them in terms of coefficients of spherical harmonic development of the potential determined over the Brillouin sphere, and corresponding to:

$$V(r, \vartheta, \varphi) = \sum_{l=0}^{\infty} \sum_{m=0}^{l} r^l P_{lm}(\cos\vartheta)[a_{lm}\cos(m\varphi) + b_{lm}\sin(m\varphi)] \qquad (0.25)$$

By replacing the second member of (0.24) with (0.25), the coefficients $\alpha_{np}$ may be expressed as a linear combination of coefficients $a_{lm}$ and $b_{lm}$:

$$\alpha_{np} = \sum_{l=0}^{\infty} \sum_{m=0}^{l} (A_{np}^{lm} a_{lm} + B_{np}^{lm} b_{lm}) \qquad (0.26)$$

where, the following quantities have been introduced:

$$A_{np}^{lm} = \frac{1}{\gamma_n^p} \frac{E_n^p(\lambda_1^{ref})}{E_n^p(\lambda_1)} \int_E \int_{\lambda_1} \frac{r^l P_{lm}(\cos\vartheta)\cos(m\varphi)}{\sqrt{(\lambda_1^2 - \lambda_2^2)(\lambda_1^2 - \lambda_3^2)}} \cdot E_n^p(\lambda_2) E_n^p(\lambda_3) dS \qquad (0.27)$$

and $$B_{np}^{lm} = \frac{1}{\gamma_n^p} \frac{E_n^p(\lambda_1^{ref})}{E_n^p(\lambda_1)} \int_E \int_{\lambda_1} \frac{r^l P_{lm}(\cos\vartheta)\sin(m\varphi)}{\sqrt{(\lambda_1^2 - \lambda_2^2)(\lambda_1^2 - \lambda_3^2)}} \cdot E_n^p(\lambda_2) E_n^p(\lambda_3) dS \qquad (0.28)$$

Once the coefficients $\alpha_{np}$ are known and the coefficients $A_{np}^{lm}$ and $B_{np}^{lm}$ have been calculated, it is possible to invert (0.26) and determine the coefficients $a_{lm}$ and $b_{lm}$, which contain more familiar field uniformity information.

This procedure, which is in principle highly complex, is dramatically simplified thanks to the symmetry properties of the transformation coefficients $A_{np}^{lm}$ and $B_{np}^{lm}$, as will be discussed in the next paragraph.

6. Symmetry Properties of the Transformation Coefficients $A_{np}^{lm}$ and $B_{np}^{lm}$ The relation of the coefficients $\alpha_{np}$ to the coefficients $\alpha_{lm}$ and $b_{lm}$ may be considerably simplified by accounting for the symmetry properties of the transformation coefficients $A_{np}^{lm}$ and $B_{np}^{lm}$. It appears that, depending on the values of n and p, the relation (0.26) is considerably simplified. More specifically, two large families of relations may be defined: with n being even and n being odd.

When n is even, the following will be obtained:

a) for $1 \leq p \leq \frac{n+2}{2}$ \qquad (0.29)

$$\alpha_{np} = \sum_l \sum_m A_{np}^{2l,2m} a_{2l,2m}$$

b) for $\frac{n+4}{2} \leq p \leq n+1$ \qquad (0.30)

$$\alpha_{np} = \sum_l \sum_m B_{np}^{2l,2m} b_{2l,2m}$$

c) for $n+2 \leq p \leq \frac{3n+2}{2}$ \qquad (0.31)

$$\alpha_{np} = \sum_l \sum_m A_{np}^{2l,2m+1} a_{2l,2m+1}$$

d) for $\frac{3n+4}{2} \leq p \leq 2n+1$ (0.32)

$$\alpha_{np} = \sum_l \sum_m B_{np}^{2l,2m+1} b_{2l,2m+1}$$

When $n$ is odd, the following will be obtained:

a) for $1 \leq p \leq \frac{n+1}{2}$ (0.33)

$$\alpha_{np} = \sum_l \sum_m A_{np}^{2l+1,2m+1} a_{2l+1,2m+1}$$

b) for $\frac{n+3}{2} \leq p \leq n+1$ (0.34)

$$\alpha_{np} = \sum_l \sum_m B_{np}^{2l+1,2m+1} b_{2l+1,2m+1}$$

c) for $n+2 \leq p \leq \frac{3n+3}{2}$ (0.35)

$$\alpha_{np} = \sum_l \sum_m A_{np}^{2l+1,2m} a_{2l+1,2m}$$

d) for $\frac{3n+5}{2} \leq p \leq 2n+1$ (0.36)

$$\alpha_{np} = \sum_l \sum_m B_{np}^{2l+1,2m} b_{2l+1,2m}$$

7. Lamé Functions and Construction thereof

As mentioned in paragraph 2, once the index n has been set and said σ=n/2, when n is even or σ=(n−1)/2 when n is odd, there will be:

σ+1 functions of type K with p=1 ... σ+1;
n−σ functions of type L with p=σ+2 ... n+1;
n−σ functions of type N with p=n+2 ... 2n−σ+1;
σ functions of type N with p=2n−σ+2 ... 2n+1;

These functions are n-order polynomials of the following type (for K):

$$K_n^p(x) = a_{0p} x^n + a_{1p} x^{n-2} + a_{2p} x^{n-4} + \ldots$$ (0.37)

where the coefficients $a_{ip}$ are typically functions of h, k and of order n.

Assuming, for example, that n=4 is set, σ=2 will follow, which will therefore generate 3 K functions, two L functions, two M functions and two N functions.

9 Functions will thus be Obtained:

$$K_4^1, K_4^2, K_4^3, L_4^4, L_4^5, M_4^6, M_4^7, N_4^8, N_4^9$$

The K functions are explicitly written as follows:

$$K_4^1(x) = x^4 + \frac{\alpha(\delta_1 - 16)}{14} x^2 - \beta \frac{(\delta_1 - 16)}{7\delta_1}$$ (0.38)

$$K_4^2(x) = x^4 + \frac{\alpha(\delta_2 - 16)}{14} x^2 - \beta \frac{(\delta_2 - 16)}{7\delta_2}$$

$$K_4^3(x) = x^4 + \frac{\alpha(\delta_3 - 16)}{14} x^2 - \beta \frac{(\delta_3 - 16)}{7\delta_3}$$

where $\alpha = h^2 + k^2$ and $\beta = h^2 k^2$ therefore they depend on the geometrical dimensions of the ellipsoid and $\delta_i$ roots of the third degree polynomial:

$$\alpha^2 \delta^3 - 20\alpha^2 \delta^2 + (208\beta + 64\alpha^2)\delta - 640\beta = 0$$ (0.39)

These roots can be proved to be always real.

In a much similar manner, explicit expressions may be determined for the other functions and for any degree n. Therefore, once the order n and the geometrical dimensions of the ellipsoid have been defined, a set of ellipsoidal harmonics suitable for the specific case may be uniquely defined.

8. Conclusions

The considerations of the previous paragraph show that the Laplace's equation may be in principle solved in an analytical-numerical manner, by using as boundary conditions the field value over a non revolving ellipsoid. Furthermore, as shown in paragraphs 5 and 6, the ellipsoidal coefficients may be transformed into the more familiar spherical coefficients for a field expansion over a characteristic sphere (Brillouin sphere). In addition to providing more direct physical information about field homogeneity, this procedure allows to calculate the shimming 'solutions' in a standard manner, i.e. considering a sphere, even though the surface being shimmed is actually an ellipsoid.

The invention claimed is:

1. A method for determining construction parameters of magnet structures designed to generate magnetic fields in predetermined volumes of space, comprising the steps of:
 a) defining a predetermined volume of space in which a magnetic field is to be generated;
 b) defining a nominal strength and a profile of a nominal desired magnetic field in said predetermined volume of space;
 c) mathematically defining the nominal desired magnetic field on a surface of and/or in said predetermined volume of space by calculating a series of coefficients using a polynomial expansion of a magnetic field-describing function; and
 d) determining a size, a geometry and a relative position in space of a magnet structure designed to generate said nominal desired magnetic field, with respect to the predetermined volume of space in and on which the nominal desired magnetic field is defined;
 the magnetic field being expressed by the coefficients of the polynomial expansion in ellipsoidal harmonics;
 wherein the calculation of the coefficients of the polynomial expansion in ellipsoidal harmonics is performed with the following steps;
 measuring three semiaxes of the ideal ellipsoid delimiting the predetermined volume having an order of approximation N;
 constructing Lamé functions from dimensions of the semiaxes up to an order of N−1;
 calculating normalization coefficients $\gamma_n^p$ according to the function $$\gamma_n^p = 8 \sum_{i=1}^{N} \omega_i^C \omega_i^L (F_n^p(x_i^L) G_n^p(x_i^C) - G_n^p(x_i^L) F_n^p(x_i^C)),$$

where $F_n^p(x_i^L)$ and $G_n^p(x_i^C)$ are related to the ellipsoidal harmonics of degree n and order p as determined in Gauss-Chebychev abscissas $x_i^C$ and Gauss-Legendre abscissas $x_i^L$, and where $\omega_i^C$ and $\omega_i^L$ represent respective weights; and calculating expansion coefficients $\alpha_n^p$ by using the function $$\alpha_n^p = \frac{2}{\gamma_n^p} \sum_{i=1}^{N/2} \sum_{j=1}^{N} \omega_i^C \omega_i^L B(x_i^C, x_i^L)(F_n^p(x_i^L) G_n^p(x_i^C) - G_n^p(x_i^L) F_n^p(x_i^C)),$$

where N represents the order of approximation and B represents the magnetic field expressed in ppm and normalized with respect to an assumed value of the magnetic field at the center of the ellipsoid.

2. A method as claimed in claim 1, wherein the magnet structure is designed with an inhomogeneity tolerance threshold of up to thousands of parts per million (ppm) and after the magnet structure is constructed, the magnet structure is subjected to a shimming correction process.

3. A method as claimed in claim 2, wherein the shimming is sequentially repeated several times.

4. A method as claimed in claim 2, wherein in the shimming process an inhomogeneity of the magnetic field within the predetermined volume of space is reduced below a tolerance threshold of up to tens of ppm peak to peak, the shimming process comprising the steps of:

measuring a magnetic field generated in said predetermined volume of space at several predetermined points in a grid of predetermined measuring points arranged in said predetermined volume of space delimited by the ideal closed surface;

comparing the measured magnetic field with the nominal desired magnetic field within said predetermined volume of space; and determining a value of a magnetic moment of magnetic shims and a position thereof over one or more shim positioning grids having a predetermined position and an orientation relative to said predetermined volume of space.

5. A method as claimed in claim 4, wherein the shimming is sequentially repeated several times.

6. A method as claimed in claim 5, wherein the shim positioning grid is configured as at least one of a cartesian grid, an annular grid formed by intersection of concentric circles and radiuses, and an ellipsoidal grid formed by a number of ellipses, one inside another, intersecting with radiuses or adjacent parallel lines.

7. A method as claimed in claim 4, wherein the shim positioning grid is configured as at least one of a cartesian grid, an annular grid formed by intersection of concentric circles and radiuses, and an ellipsoidal grid formed by a number of ellipses, one inside another, intersecting with radiuses or adjacent parallel lines.

8. A method as claimed in claim 7, wherein the ellipses of the ellipsoidal grid are concentric or confocal.

9. A method as claimed in claim 1, wherein the ideal surface that delimits the predetermined volume of space corresponds to an ellipsoid enveloping a limb, an organ, a body part under examination, a body under examination, or an anatomic region under examination and having a size that provides a highest filling ratio in the volume of space by the limb, the organ, the body under examination, the body part under examination, or the anatomic region under examination.

10. A method as claimed in claim 1, wherein the magnetic field is a static magnetic field of an MRI apparatus, which permeates a predetermined part of the volume that is defined by a cavity designed to receive a limb, an organ, a body part under examination, a body under examination, or an anatomic region under examination.

11. A shimming method for correcting magnetic fields in predetermined volumes of space, comprising the following steps:

defining a predetermined volume of space, which is permeated by the magnetic field, by defining an ideal closed delimiting surface;

measuring a magnetic field generated in said predetermined volume of space at several predetermined points in a grid of predetermined measuring points arranged in said predetermined volume of space delimited by the ideal closed surface and/or along said ideal closed surface;

comparing the measured magnetic field with a nominal desired magnetic field within said predetermined volume of space and/or over the ideal closed delimiting surface; and determining a value of magnetic moment of magnetic shims and a position thereof over one or more shim positioning grids having a predetermined position and an orientation relative to said predetermined volume of space, the magnetic field being expressed by a polynomial expansion in ellipsoidal harmonics;

wherein the calculation of the coefficients of the polynomial expansion in ellipsoidal harmonics is performed with the following steps:

measuring three semiaxes of the ideal ellipsoid delimiting the predetermined volume having an order of approximation N;

constructing Lamé functions from dimensions of the semiaxes up to an order of N−1;

calculating normalization coefficients $\gamma_n^p$ according to the function $$\gamma_n^p = 8 \sum_{i=1}^{N} \omega_i^C \omega_i^L (F_n^p(x_i^L) G_n^p(x_i^C) - G_n^p(x_i^L) F_n^p(x_i^C)),$$

where $F_n^p(x_i^L)$ and $G_n^p(x_i^C)$ are related to the ellipsoidal harmonics of degree n and order p, as determined in Gauss-Chebychev abscissas $x_i^C$ and Gauss-Legendre abscissas $x_i^L$ and where $\omega_i^C$ and $\omega_i^L$ represent respective weights; and calculating expansion coefficients $\alpha_i^L$ by using the function $$\alpha_n^p = \frac{2}{\gamma_n^p} \sum_{i=1}^{N/2} \sum_{j=1}^{N} \omega_i^C \omega_i^L B(x_i^C, x_i^L)(F_n^p(x_i^L) G_n^p(x_i^C) - G_n^p(x_i^L) F_n^p(x_i^C)),$$

where N represents the order of approximation and B represents the magnetic field expressed in ppm and normalized with respect to an assumed value of the magnetic field at the center of the ellipsoid.

12. A method as claimed in claim 11, wherein the shimming is sequentially repeated several times.

13. A method as claimed in claim 11, wherein the shim positioning grid is configured as at least one of a cartesian grid, an annular grid formed by intersection of concentric circles and radiuses, and an ellipsoidal grid formed by a number of ellipses, one inside another, intersecting with radiuses or adjacent parallel lines.

14. A method as claimed in claim 13, wherein the ellipses of the ellipsoidal grid are concentric or confocal.

* * * * *